(12) United States Patent
Wu et al.

(10) Patent No.: US 9,209,029 B2
(45) Date of Patent: Dec. 8, 2015

(54) ASYMMETRICAL GATE MOS DEVICE AND METHOD OF MAKING

(75) Inventors: Dongping Wu, Shanghai (CN); Cheng Hu, Shanghai (CN); Lun Zhu, Shanghai (CN); Zhiwei Zhu, Shanghai (CN); Shili Zhang, Uppsala (SE); Wei Zhang, Shanghai (CN)

(73) Assignee: FUDAN UNIVERSITY, Shanghai (CN)

( * ) Notice: Subject to any disclaimer, the term of this patent is extended or adjusted under 35 U.S.C. 154(b) by 92 days.

(21) Appl. No.: 14/113,705

(22) PCT Filed: Dec. 28, 2011

(86) PCT No.: PCT/CN2011/084808
§ 371 (c)(1),
(2), (4) Date: Oct. 24, 2013

(87) PCT Pub. No.: WO2012/146044
PCT Pub. Date: Nov. 1, 2012

(65) Prior Publication Data
US 2014/0048875 A1    Feb. 20, 2014

(30) Foreign Application Priority Data

Apr. 26, 2011    (CN) .......................... 2011 1 0106296

(51) Int. Cl.
| H01L 21/336 | (2006.01) |
|---|---|
| H01L 21/28 | (2006.01) |
| H01L 21/285 | (2006.01) |
| H01L 29/04 | (2006.01) |
| H01L 29/66 | (2006.01) |
| H01L 29/78 | (2006.01) |
| H01L 29/49 | (2006.01) |
| H01L 21/265 | (2006.01) |

(52) U.S. Cl.
CPC ...... *H01L 21/28008* (2013.01); *H01L 21/2815* (2013.01); *H01L 21/28097* (2013.01); *H01L 21/28105* (2013.01); *H01L 21/28518* (2013.01); *H01L 29/04* (2013.01); *H01L 29/4975* (2013.01); *H01L 29/6659* (2013.01); *H01L 29/66575* (2013.01); *H01L 29/66659* (2013.01); *H01L 29/7835* (2013.01); *H01L 21/26586* (2013.01)

(58) Field of Classification Search
CPC .............. H01L 29/04; H01L 21/28518; H01L 29/66659
USPC .......................................... 257/336; 438/286
See application file for complete search history.

(56) References Cited

U.S. PATENT DOCUMENTS

| 7,790,611 | B2* | 9/2010 | Anderson et al. ............. 438/653 |
|---|---|---|---|
| 2001/0021579 | A1* | 9/2001 | Hu et al. ........................ 438/625 |
| 2005/0245008 | A1* | 11/2005 | Doris et al. .................... 438/151 |
| 2006/0237777 | A1* | 10/2006 | Choi et al. ..................... 257/321 |

(Continued)

*Primary Examiner* — Asok K Sarkar
*Assistant Examiner* — Igwe U Anya
(74) *Attorney, Agent, or Firm* — Jamie J. Zheng, Esq.

(57) ABSTRACT

An asymetric gate MOS device is disclosed. The gate is a metal gate, and the metal gate has a different work function on the source side from that on the drain side of the MOS device, so that the overall performance parameters of the MOS device are more optimized. A method of making an asymetric gate MOS device is also disclosed. In the method, dopant ions are implanted into the gate of the MOS device, so as to cause the gate to have a different work function on the source side from that on the drain side of the MOS device. As a result, the overall performance parameters of the MOS device are more optimized. The method can be easily implemented.

13 Claims, 8 Drawing Sheets

(56) References Cited

U.S. PATENT DOCUMENTS

2006/0263961 A1* 11/2006 Kittl et al. .................. 438/199
2009/0242986 A1* 10/2009 Nakabayashi et al. ........ 257/347
2010/0068859 A1* 3/2010 Doornbos et al. ............ 438/296

* cited by examiner

ASYMMETRICAL GATE MOS DEVICE AND METHOD OF MAKING

FIELD

The present invention is related to semiconductor processing technologies, and more particularly to an asymmetrical gate MOS device and method of making.

BACKGROUND

Since the invention of the first transistor and after decades of rapid development, lateral and longitudinal dimensions of transistors have shrunk drastically. According to the forecast of International Technology Roadmap for Semiconductors (ITRS), the feature sizes of transistors may reach 7 nm by 2018. The continual reduction in the feature sizes results in continual enhancement of the performance (speed) of transistors. It also enables us to integrate more and more devices on a chip of the same area, and to make integrated circuits with better and better performance, while at the same time reducing unit function costs.

The continued shrinking in device feature sizes, however, also brings a series of challenges. When device feature sizes enter deep sub-micron range, short channel effect (SCE), drain induced barrier lower effect (DIBL), and hot carrier effect (HCE) etc., in the devices become more and more serious, degrading device performance. Conventional technologies mainly use channel engineering to solve these problems. Channel engineering attempts to enhance device performance by using non-uniform channel doping, so as to achieve continuous distribution of channel electric field.

In channel engineering, many devices with new channel architectures have been proposed, such as lightly doped drain (LDD), pocket and halo architectures, etc. The LDD architecture can effectively absorb the electric flux line on the drain side, reduce the device electric field on the drain side, and suppress hot carrier effect. By localized heavy doping on the source side, pocket and halo architecture can raise the potential barrier on the source side, weaken the effect of the drain side electric field on the potential barrier on the source side, effectively suppress the shifting of the device threshold voltage, source-drain punch through and device DIBL effect.

However, the LDD architecture discussed above can increase the device source-drain serial resistance, and reduce the device drive current. In the pocket architecture, the device threshold voltage may increase when the implant dosage/energy for the pockets increases, causing reduction of the saturated drive current, and reducing the device operation speed.

To solve the above problems, asymmetric gate field effect transistors are currently proposed. The so called asymmetric gate field effect transistor refers to a transistor in which the gate structure is different at the source region from that at the drain region, causing asymmetry in the electrical and physical properties at the carrier emitting side (source) and the carrier collecting side (drain), so that the overall performance of the transistor is more optimized. This is especially important in the design and optimization of future very small-scale transistors.

In conventional method of making asymmetric gate field effect transistors, a gate oxide layer having different thicknesses on the source side and the drain side is typically formed. By adjusting the gate oxide thickness on the source side and on the drain side, channel electric field distribution can be adjusted, and the overall performance of the transistors is enhanced.

However, the above method of making asymmetric gate field effect transistors by forming a gate oxide layer with uneven thicknesses on the source side and the drain side has certain difficulties in processing technologies, which are difficult to control in practice.

SUMMARY

The purpose of this invention is to provide an asymmetrical gate MOS device and its method of making, in order to improve the performance of MOS devices.

To solve the above problems, the present invention provides an asymmetrical gate MOS device. The gate of the MOS device is a metal gate, and the metal gate has a different work function on the source side from that on the drain side of the MOS device.

In one embodiment, the metal gate includes a metal-semiconductor-compound nanowire.

In one embodiment, the MOS device comprises, specifically:
  a semiconductor substrate;
  a gate oxide layer formed over the semiconductor substrate;
  a gate formed over the gate oxide layer, wherein the gate has sidewalls formed on its two sides; and
  source/drain regions formed in the semiconductor substrate on the two sides of the gate.

In one embodiment, the length of the metal gate is about 2~11 nm.

In one embodiment, the semiconductor substrate includes silicon or silicon on insulator, and the metal-semiconductor-compound nanowire is a metal silicide nanowire.

In one embodiment, the semiconductor substrate includes germanium or germanium on insulator, and the metal-semiconductor-compound nanowire is a metal germanide nanowire.

At the same time, in order to solve the above problems, the present invention also provides a method of making an asymmetric gate MOS device. The method comprises:
  providing a semiconductor substrate;
  fabricating a gate oxide layer on the semiconductor substrate;
  fabricating a gate over the gate oxide layer, and implanting dopant ions into the gate to cause the gate to have different work functions on its two sides;
  forming sidewalls on the two sides of the gate;
  performing source/drain implant to form source/drain regions in the semiconductor substrate.

In one embodiment, fabricating the gate over the gate oxide layer further comprises:
  forming consecutively a polycrystalline semiconductor layer and an insulator layer over the gate oxide layer;
  consecutively etching the insulator layer and the polycrystalline semiconductor layer to remove portions of the insulator layer and the polycrystalline semiconductor layer on two sides;
  depositing metal films on sidewalls of the two sides of the polycrystalline semiconductor layer, metal in the metal films diffusing toward the polycrystalline semiconductor layer;
  removing the metal films remaining on surfaces of the sidewalls of the polycrystalline semiconductor layer;
  performing annealing on the polycrystalline semiconductor layer to form metal-semiconductor-compound nanowires on the sidewall surfaces of the polycrystalline semiconductor layer;
  removing the insulator layer and the polycrystalline semiconductor layer;

etching the gate oxide layer using the metal-semiconductor-compound nanowires as a mask; and implanting dopant ions into the metal-semiconductor-compound nanowires to cause each metal-semiconductor-compound nanowire to have different work functions on its two sides.

In one embodiment, dopant ions implanted into the metal-semiconductor-compound nanowires are any of phosphorous (P) ions, arsenide (As) ions, boron (B) ions or any combination thereof.

In one embodiment, implanting dopant ions into the metal-semiconductor-compound nanowires to cause a respective metal-semiconductor-compound nanowire to have different work functions on its two sides is performed using single-sided ion implant on the metal-semiconductor-compound nanowire.

In one embodiment, implanting dopant ions into the metal-semiconductor-compound nanowires to cause a respective metal-semiconductor-compound nanowire to have different work functions on its two sides is performed using double-sided ion implant on the metal-semiconductor-compound nanowire.

In one embodiment, the metal films are deposited onto sidewalls on two sides of the polysilicon layer using a PVD process.

In one embodiment, during the PVD process to deposit the metal films, a target material is partially ionized into an ionic state, to cause it to produce metal ions, and a first bias voltage is applied to the polycrystalline semiconductor layer.

In one embodiment a second bias voltage is applied to the target material to partially ionize the target material into an ionic state.

In one embodiment, the first bias voltage is any of a direct current bias voltage, an alternating current bias voltage and a pulsed bias voltage.

In one embodiment, the second bias voltage is any of a direct current bias voltage, an alternating current bias voltage and a pulsed bias voltage.

In one embodiment, the semiconductor substrate is silicon or silicon-on-insulator, the polycrystalline semiconductor layer is a polysilicon layer, and the metal-semiconductor-compound nanowires are metal silicide nanowires.

In embodiment, the semiconductor substrate is germanium or germanium-on-insulator, the polycrystalline semiconductor layer is a polycrystalline germanium layer, and the metal-semiconductor-compound nanowires are metal germanide nanowires.

In some embodiments, the metal-semiconductor-compound nanowires are formed from chemical reaction between metal and the polycrystalline semiconductor layer, wherein, the metal can be any of nickel, cobalt, titanium, and ytterbium, or any of nickel, cobalt, titanium, and ytterbium incorporated with platinum.

In some embodiments, the metal is further incorporated with tungsten and/or molybdenum.

In some embodiments, the substrate is at a temperature of 0~300° C. during the deposition of the metal film on the sidewalls on two sides of the polycrystalline semiconductor layer.

In some embodiments, the annealing temperature is about 200~900° C.

Compared with conventional technologies, the asymmetric gate MOS device provided by the present invention has a metal gate. The metal gate has different work functions on the source side and on the drain side of the MOS device, so that the overall performance parameters of the MOS device are more optimized.

Compared with conventional technologies, the method of making an asymmetric gate MOS device, as provided by the present invention, causes the gate work function to be different on the source side from that on the drain side of the MOS device by implanting dopant ions into the gate of the MOS device, so that the overall performance parameters of the MOS device are more optimized. The method can be easily implemented.

DESCRIPTION OF EMBODIMENTS

An asymmetric MOS device and its method of making, as provided by the present invention, are explained in more detail below in connection with specific embodiments and with reference to the drawings. The advantages and features of the present invention will become clear after the following explanations and claims, Note that the drawings use simplified forms and inaccurate proportions, and are used merely to conveniently and clearly explain the embodiments.

As a key idea of the present invention, an asymmetric gate MOS device is provided, which has a metal gate. The metal gate has different work functions on the source side and on the drain side of the MOS device, so that the overall performance parameters of the MOS device are more optimized. At the same time, a method of making the asymmetric gate MOS device is also provided. By implanting dopant ions into the gate of the MOS device, the method causes the gate to have different work functions on the source side and on the drain side of the MOS device, so that the overall performance parameters of the MOS device are further optimized. The method is easy to implement.

Figure 1:
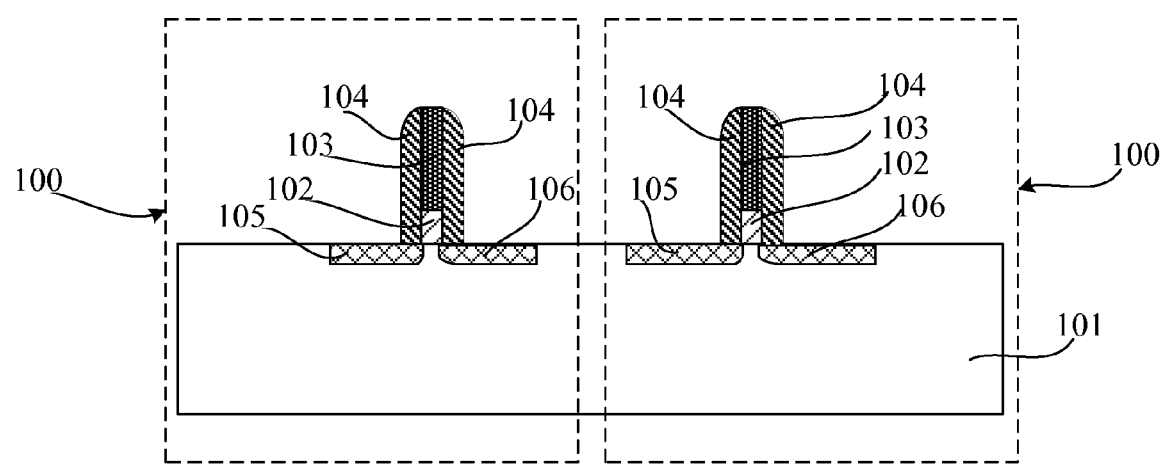
FIG. 1 is a cross-sectional diagram illustrating an asymmetric gate MOS device according to embodiments of the present invention.

Reference is now made to FIG. 1, which is a cross-sectional diagram illustrating an asymmetric gate MOS device, as provided by embodiments of the present invention. As shown in FIG. 1, the asymmetrical gate MOS device 100 provided by the present invention has a metal gate, and the metal gate has a different work functions on the source side and on the drain side of the MOS device 100. Specifically, the asymmetric gate MOS device 100 provided by embodiments of the present invention comprises:

a semiconductor substrate 101;

a gate oxide layer 102 formed over the semiconductor substrate 101, wherein the gate oxide layer 102 is a high-K dielectric layer;

a gate formed over the gate oxide layer 102, wherein sidewalls 104 are formed on two sides of the gate, wherein the gate is a metal gate that has different work functions on its two sides, and wherein, in one specific embodiment, the gate is a metal-semiconductor-compound nanowire 103; and source/drain regions formed in the semiconductor substrate 101 on two sides of the gate, including, specifically, a source region 105 and a drain region 106 formed in the semiconductor substrate 101 on two sides of the gate, wherein the metal gate has different work functions with respect to the source region 105 and the drain regions 106.

In further embodiments, the length of the metal gate is about 2~11 nm, meaning that the MOS device 100 provided by embodiments of the preset invention has a feature size of about 2~11 nm.

In further embodiments, the semiconductor substrate 101 includes silicon or silicon on insulator, and the metal-semiconductor-compound nanowire 103 is a metal silicide nanowire.

In further embodiments, the semiconductor substrate 101 includes germanium or germanium on insulator, and the metal-semiconductor-compound nanowire 103 is a metal germanide nanowire.

Figure 2:
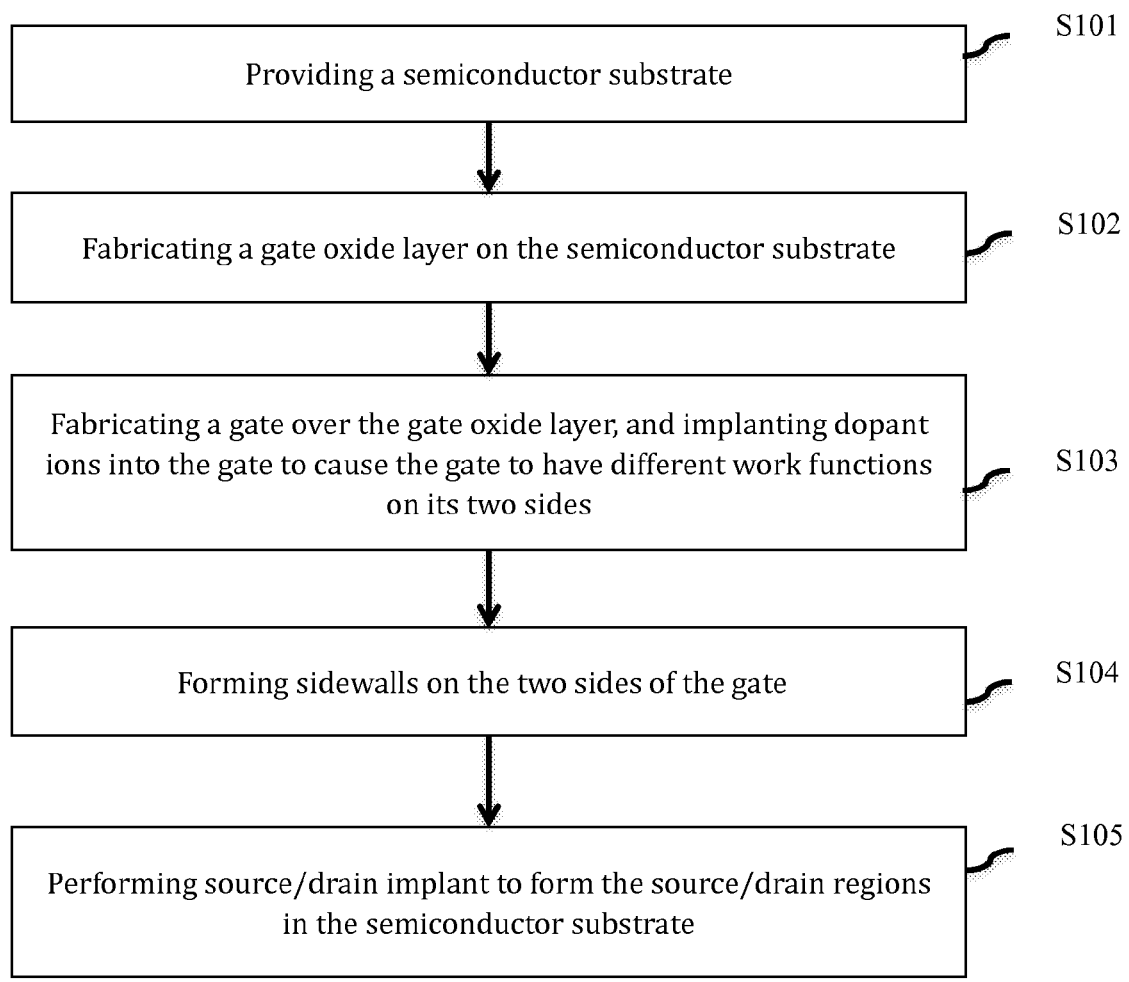
FIG. 2 is a flowchart illustrating a method of making an asymmetric gate MOS device, as provided by embodiments of the present invention.

Reference is now made to FIG. 2, and FIGS. 3A to 3K, where FIG. 2 is a flowchart illustrating a method of making an asymmetric gate MOS device, as provided by embodiments of the present invention, and FIGS. 3A to 3K are device cross-sectional diagrams illustrating various steps in the method of making an asymmetric gate MOS device, as provided by embodiments of the present invention. Referring to FIG. 2, and FIGS. 3A to 3K, a method of making an asymmetric gate MOS device 100 comprises steps S101 through S105, as discussed below.

S101—A semiconductor substrate 101 is provided.

S102—A gate oxide layer 102 is fabricated on the semiconductor substrate 101, wherein the gate oxide layer 102 is a high-K dielectric layer.

Figure 3A:
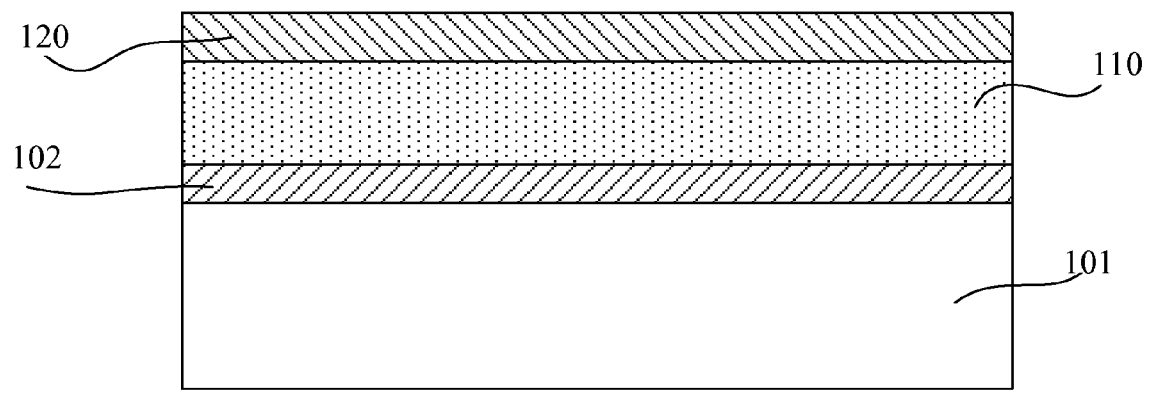
FIGS. 3A to 3K are device cross-sectional diagrams illustrating various steps in the method of making an asymmetric gate MOS device, as provided by embodiments of the present invention.
Figure 3B:
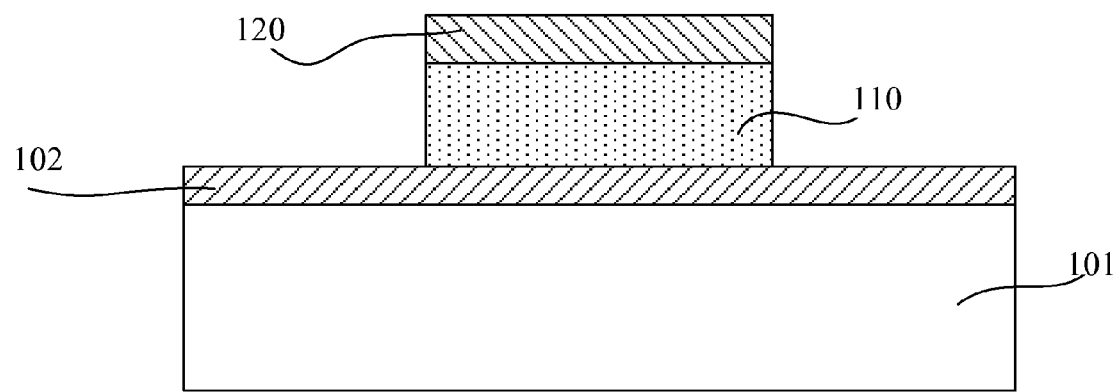
Figure 3C:
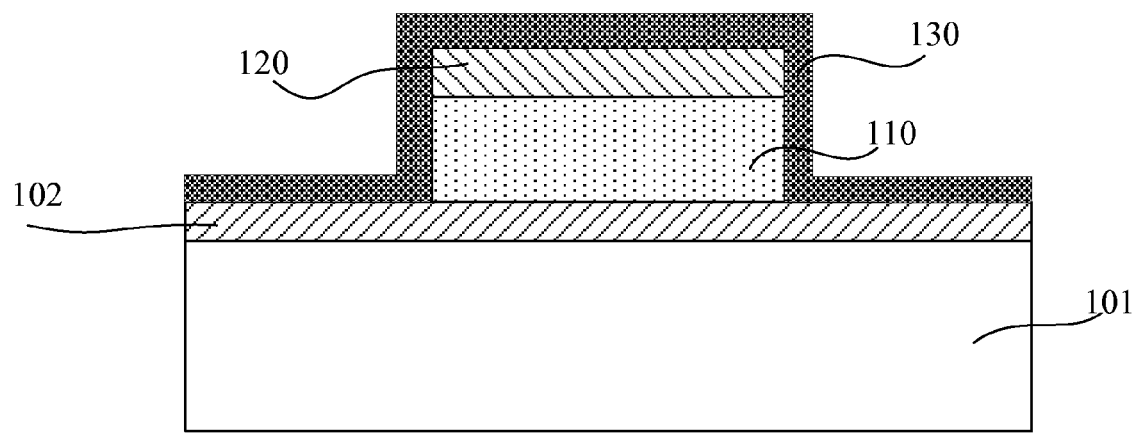
Figure 3D:
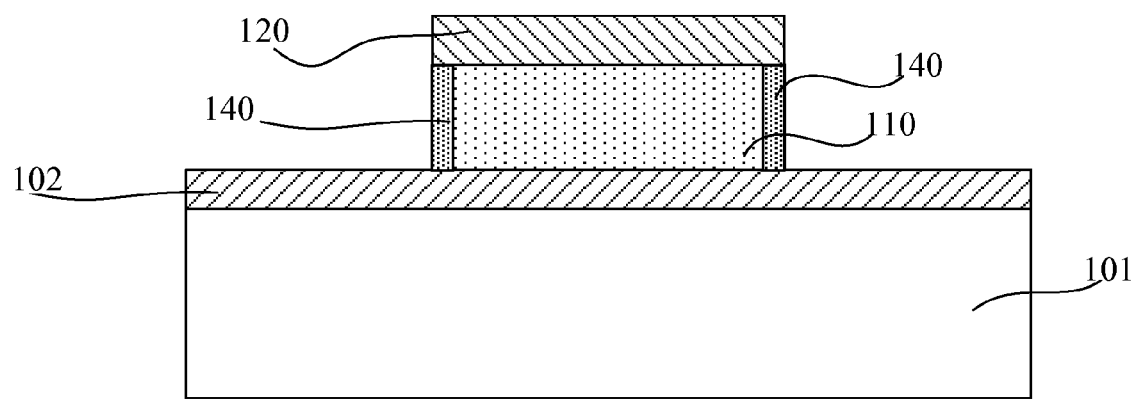
Figure 3E:
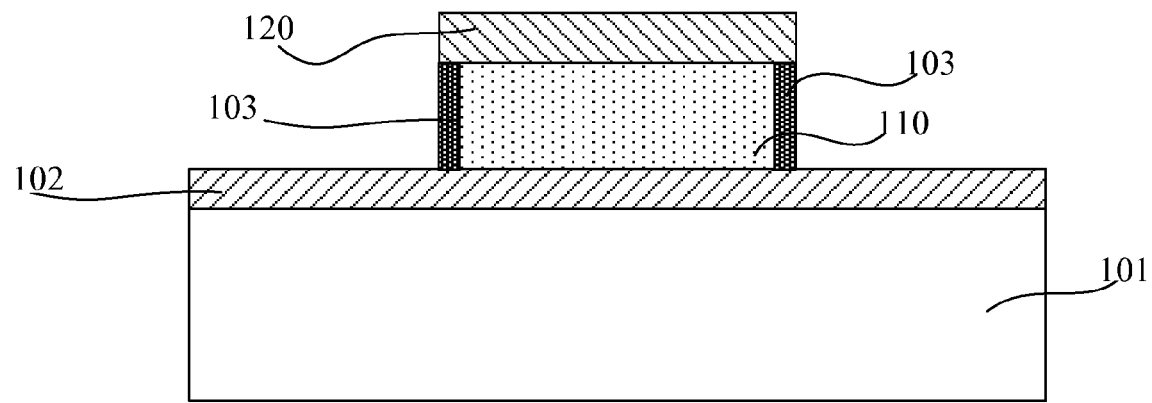
Figure 3F:
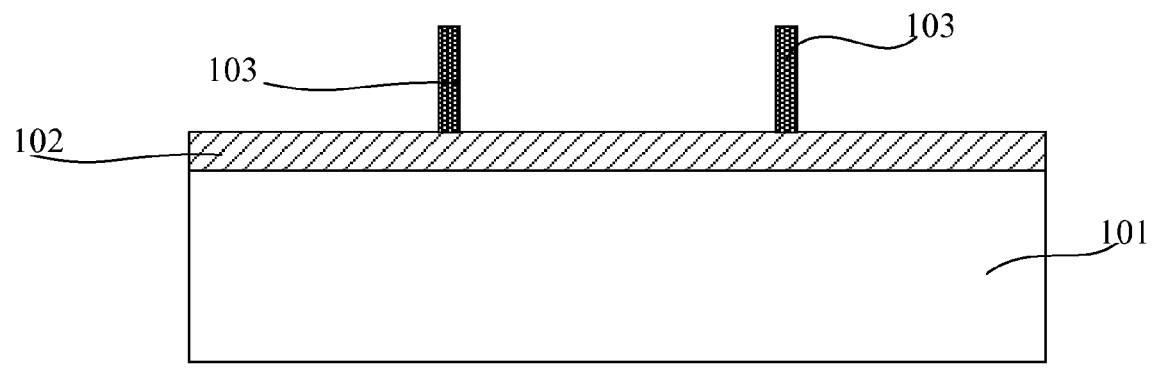
Figure 3G:
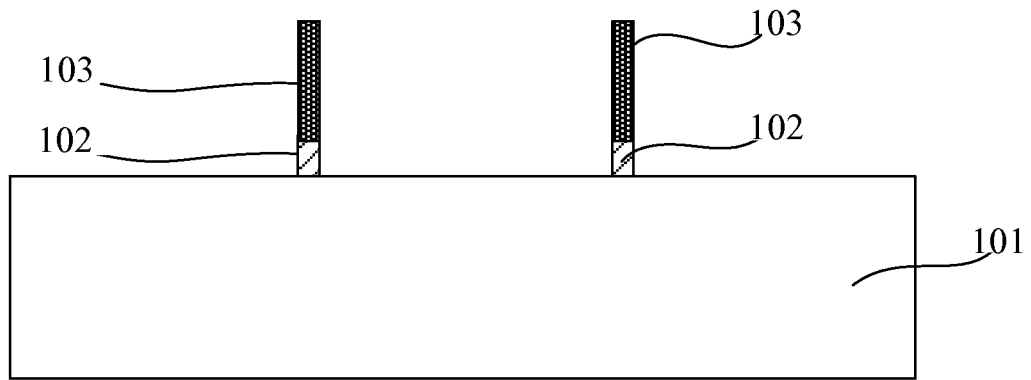
Figure 3H:
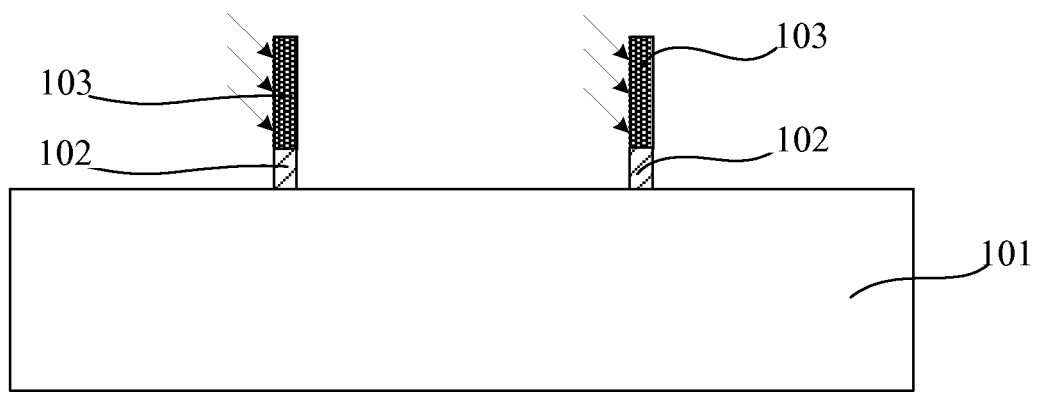
Figure 3I:
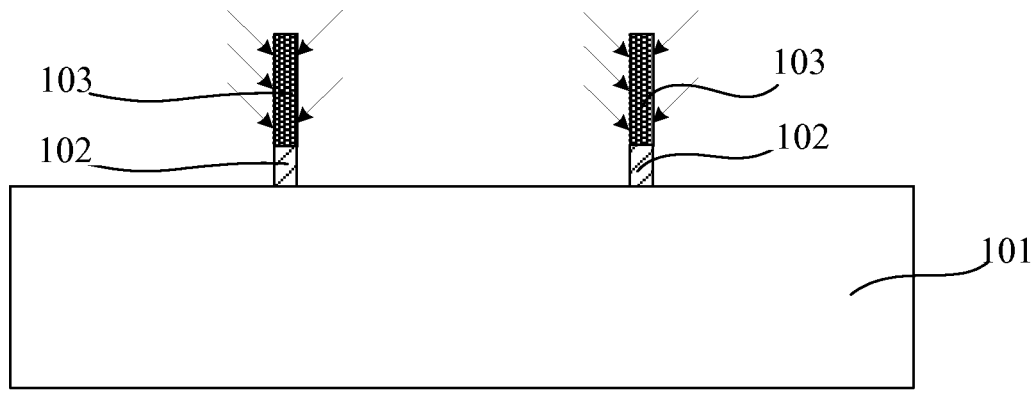

S103—A gate is fabricated over the gate oxide layer 102, and dopant ions are implanted into the gate to cause the gate to have different work functions on its two sides, wherein the gate is a metal gate, and wherein, in one embodiment of the present invention, the metal gate is a metal-semiconductor-compound nanowire 103. Specifically, fabricating the gate over the gate oxide layer 102 further comprises:

forming consecutively a polycrystalline semiconductor layer 110 and an insulator layer 120 over the gate oxide layer 102, as shown in FIG. 3A;

consecutively etching the insulator layer 120 and the polycrystalline semiconductor layer 110 to remove portions of the insulator layer 120 and the polycrystalline semiconductor layer 110 on two sides, as shown in FIG. 3B;

depositing a metal film 130 on each of the two sides of the polycrystalline semiconductor layer 110, metal in the metal film 130 diffusing toward the polycrystalline semiconductor layer 110, as shown in FIG. 3C;

removing the metal film 130 remaining on sidewall surfaces of the polycrystalline semiconductor layer 110, as shown in FIG. 3D, wherein a thin metal-containing semiconductor layer 140 is formed on surfaces of the polycrystalline semiconductor 110 layer after the metal diffuses to the surfaces of the polycrystalline semiconductor layer 110;

performing annealing on the polycrystalline semiconductor layer 110 to form metal-semiconductor-compound nanowires 103 on sidewall surfaces of the polycrystalline semiconductor layer 110, as shown in FIG. 3E;

removing the insulator layer 120 and the polycrystalline semiconductor layer 110, as shown in FIG. 3F;

etching the gate oxide layer 102 using the metal-semiconductor-compound nanowires 103 as a mask, as shown in FIG. 3, which is a cross-sectional diagram of the device after the etching; and implanting dopant ions into the metal-semiconductor-compound nanowires 103 to cause each of the metal-semiconductor-compound nanowires 103 to have different work functions on its two sides, wherein the dopant ions implanted into the metal-semiconductor-compound nanowire 103 are any of phosphorous (P) ions, arsenide (As) ions, boron (B) ions or any combination thereof. Implanting dopant ions can be performed using single-sided ion implant on the metal-semiconductor-compound nanowires 103, as shown in FIG. 3H, where dopant ions are implanted into the sidewall on one side of a respective metal-semiconductor-compound nanowire 103, so as to cause the metal-semiconductor-compound nanowire 103 to be doped differently on its two sides. Implanting dopant ions may also be performed using double-sided ion implant on the metal-semiconductor-compound nanowires 103, as shown in FIG. 3I, where dopant ions are implanted into sidewalls on both sides of a respective metal-semiconductor-compound nanowire 103 while choosing different ion implant doses or different types of ions for the two sides, so as to cause the metal-semiconductor-compound nanowire 103 to be doped differently on its two sides.

Because the implanted ions can congregate near the interface between the metal-semiconductor-compound nanowire 103 and the gate oxide layer 102, thereby changing the work functions between the metal-semiconductor-compound nanowire 103 and the gate oxide layer 102, and because the work function of the gate determines the threshold voltage of the device, by adjusting the gate work functions at the source region and at the drain region, making them different, so as to create asymmetry in the electrical and physical properties at the source region and at the drain region, the overall performance parameters of the transistor can be more optimized.

Figure 3J:
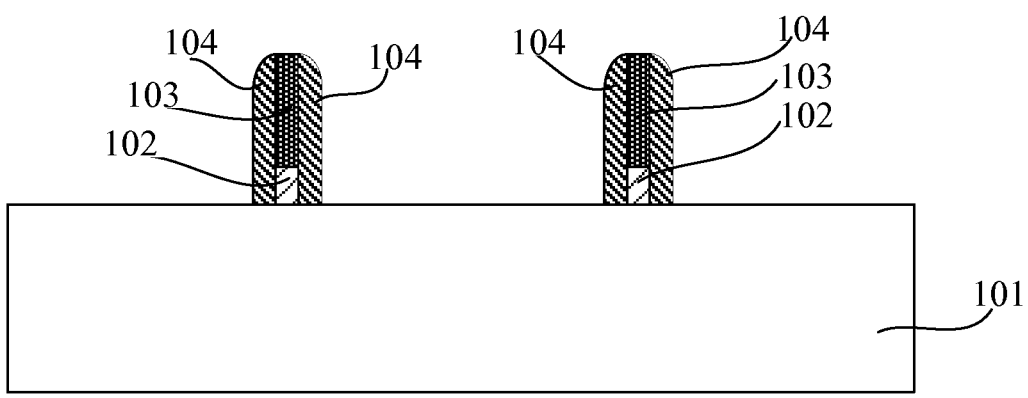
Figure 3K:
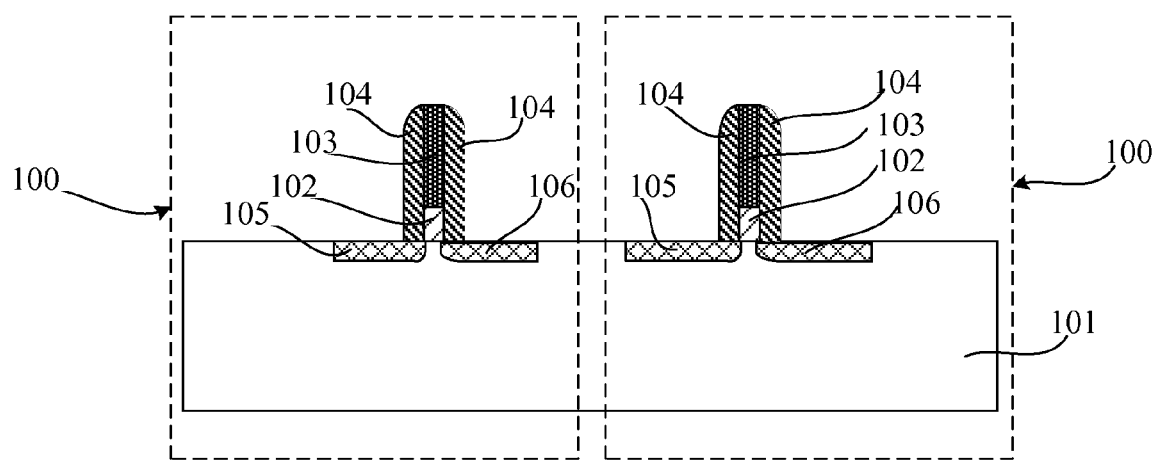

S104—Forming sidewalls 104 on the two sides of the gate, as shown in FIG. 3J;

S105—Performing source/drain implants to form source/drain regions in the semiconductor substrate 101, wherein, a source region 106 and a drain region 107 are formed in the semiconductor substrate 101 on two sides of the gate, completing the fabrication of the asymmetric gate MOS device 100, as shown in FIG. 3K.

S105—Performing source/drain implants to form source/drain regions in the semiconductor substrate 101, wherein, a source region 105 and a drain region 106 are formed in the semiconductor substrate 101 on two sides of the gate, completing the fabrication of the asymmetric gate MOS device 100, as shown in FIG. 3K.

In further embodiments, the metal films 130 are deposited onto sidewalls on two sides of the polycrystalline semiconductor layer 110 using a PVD process. In one embodiment, during the PVD process to deposit the metal film 130, a target material is partially ionized into an ionic state, to cause it to produce metal ions, and a first bias voltage is applied to the polycrystalline semiconductor layer 110. In one embodiment a second bias voltage is applied to the target material to partially ionize the target material into an ionic state. In one embodiment, the first bias voltage is any of a direct current bias voltage, an alternating current bias voltage and a pulsed bias voltage. In one embodiment, the second bias voltage is any of a direct current bias voltage, an alternating current bias voltage and a pulsed bias voltage.

By partially ionizing the target material into an ionic state, causing it to produce metal ions, and by applying the first bias voltage to the polycrystalline semiconductor layer 110, causing the metal ions to accelerate toward the sidewalls of the polycrystalline semiconductor layer 110 and to enter the polycrystalline semiconductor layer 110, more metal ions can diffuse to the sidewalls of the polycrystalline semiconductor layer 110, and greater diffusion depth can be obtained. Thus, the eventually formed nanowires 103 can have increased width, and the asymetric gate MOS device 100 provided by embodiments of the present invention can have longer gate and larger feature sizes. Therefore, the asymetric gate MOS device 100 provided by embodiments of the present invention can have adjustable gate length. In some embodiments, the gate length of the asymetric gate MOS device 100 can be 2~11 nm.

Note that in one embodiment of the present invention, a second bias voltage is applied on the target material to partially ionize the target material into the ionic state. The present invention is not thus limited, however, any means of partially ionizing the target material into an ionic state would be included in the scope of protection for the present invention.

In further embodiments, the semiconductor substrate 101 is silicon or silicon-on-insulator substrate, the polycrystalline semiconductor layer 110 is a polysilicon layer, and the metal-semiconductor-compound nanowire 103 is a metal silicide nanowire.

In further embodiments, the semiconductor substrate 101 is germanium or germanium-on-insulator substrate, the polycrystalline semiconductor layer 110 is a polycrystalline germanium layer, and the metal-semiconductor-compound nanowire is a metal germanide nanowire.

Note that in a specific embodiment of the present invention, the semiconductor substrate 101 can be silicon or silicon on insulator, or germanium or germanium on insulator. Understandably, the present invention is not thus limited. The semiconductor substrate 101 can be another kind of semiconductor substrate, such as gallium arsenide or another III-V compound semiconductor substrate, etc.

In further embodiments, the metal-semiconductor-compound nanowire 103 is formed by chemical reactions between metal and the polycrystalline semiconductor layer 110. The metal can be any of nickel, cobalt, titanium, and ytterbium, or any of nickel, cobalt, titanium, and ytterbium incorporated with platinum. The platinum is incorporated because pure nickel silicide has poor stability at higher temperature, or tends to become non-uniform and agglomerate, or forms nickel di-silicide ($NiSi_2$), which has a high resistivity, seriously affecting device performance. Therefore, in order to slow down the formation of nickel silicide and prevent agglomeration and nickel di-silicide formation at high temperature, nickel is incorporated with platinum by a certain ratio. Platinum incorporation for other metals can be similarly explained.

In further embodiments, the metal is further incorporated with tungsten and/or molybdenum, so as to further control the formation of nickel silicide or platinum incorporated nickel silicide and the diffusion of nickel/platinum, and to further enhance the thermal stability of the nickel silicide or platinum incorporated nickel silicide. Tungsten and/or molybdenum incorporation for other metals can be similarly explained.

In a further embodiment, the substrate temperature is at 0~300° C. during the deposition of the metal films 130 on the two sides of polycrystalline semiconductor layer 110, because for nickel, deposition temperature exeeding 300° C. can result in excessive nickel diffusion and nickel reacting directly with polycrystalline semiconductor (such as polysilicon) layer 110 to form nickel silicide, leading to loss of control of film thickness. Under specified temperature, nickel would diffuse into the polysilicon sidewalls through surfaces of the polysilicon sidewalls, and such diffusion has the characteristics of self-saturation, that is, the diffusion of nickel into the polysilicon sidewalls only happens in a thin surface layer of polysilicon, forming a thin nickel layer of a certain silicon/nickel ratio. The thickness of the thin nickel layer is related to the substrate temperature during deposition. The higher the temperature, the thicker the thin nickel layer. At room temperature, an equivalent nickel thickness of the thin nickel layer is about 2 nanometers.

In further embodiments, the annealing is performed at a temperature of 200~900° C.

Because the metal-semiconductor-compound nanowires 103 provided by embodiments of the present invention are formed by depositing the metal films 130 on sidewalls on two sides of the polycrystalline semiconductor layer 110, the metal in the metal films 130 diffusing toward the sidewall surfaces of the polycrystalline semiconductor layer 110 and forming, after annealing, metal-semiconductor compound nanowires (i.e., metal gates) 103 on the sidewall surfaces of the polycrystalline semiconductor layer 110, high-resolution lithography is not required to form the metal-compound-semiconductor nanowires 103, resulting in significant cost saving.

In summary, the present invention provides an asymmetric gate MOS device, which has a metal gate. The metal gate has different work functions on the source side and the drain side of the MOS device, so that the overall performance parameters of the MOS device are more optimized. At the same time, a method of making the asymmetric gate MOS device is also provided. The method causes the gate work function to be different on the source side from that on the drain side of the MOS device by implanting dopant ions into the gate of the MOS device, so that the overall performance parameters of the MOS device are more optimized. The method can be easily implemented.

Obviously, without departing from the spirit and scope of the present invention, those skilled in the art can make various improvements and modification. Thus, if such improvements and modifications fall into the scope of protection of the claims and their equivalents, the present invention intends to include such improvements and modifications.

We claim:

1. A method of making an asymmetric gate MOS device comprising:
    providing a semiconductor substrate,
    fabricating a gate oxide layer on the semiconductor substrate;
    fabricating a gate comprising metal over the gate oxide layer, and implanting dopant ions into the gate to cause the gate to have different work functions on its two sides;
    forming sidewalls on the two sides of the gate; and
    performing source/drain implant to form source/drain regions in the semiconductor substrate;
    wherein fabricating the gate over the gate oxide layer further comprises:
    forming consecutively a polycrystalline semiconductor layer and an insulator layer over the gate oxide layer;
    consecutively etching the insulator layer and the polycrystalline semiconductor layer to remove portions of the insulator layer and the polycrystalline semiconductor layer on two sides;
    depositing metal films on sidewalls of the two sides of the polycrystalline semiconductor layer, metal in the metal films diffusing toward the polycrystalline semiconductor layer;
    removing the metal films remaining on surfaces of the sidewalls of the polycrystalline semiconductor layer;
    performing annealing on the polycrystalline semiconductor layer to form metal-semiconductor-compound nanowires on the sidewall surfaces of the polycrystalline semiconductor layer;
    removing the insulator layer and the polycrystalline semiconductor layer;

etching the gate oxide layer using the metal-semiconductor-compound nanowires as a mask; and implanting dopant ions into the metal-semiconductor-compound nanowires to cause each metal-semiconductor-compound nanowire to have different work functions on its two sides.

2. A method of making an asymmetric gate MOS device according to claim 1, characterized in that, dopant ions implanted into the metal-semiconductor-compound nanowires are any of phosphorous (P) ions, arsenide (As) ions, boron (B) ions or any combination thereof.

3. A method of making an asymmetric gate MOS device according to claim 2, characterized in that, implanting dopant ions into the metal-semiconductor-compound nanowires to cause a respective metal-semiconductor-compound nanowire to have different work functions on its two sides is performed using single-sided ion implant on the metal-semiconductor-compound nanowire.

4. A method of making an asymmetric gate MOS device according to claim 2, characterized in that, implanting dopant ions into the metal-semiconductor-compound nanowires to cause a respective metal-semiconductor-compound nanowire to have different work functions on its two sides is performed using double-sided ion implant on the metal-semiconductor-compound nanowire.

5. A method of making an asymmetric gate MOS device according to claim 1, characterized in that, the metal films are deposited onto sidewalls on two sides of the polysilicon layer using a PVD process.

6. A method of making an asymmetric gate MOS device according to claim 5, characterized in that, during the PVD process to deposit the metal films, a target material is partially ionized into an ionic state, to cause it to produce metal ions, and a first bias voltage is applied to the polycrystalline semiconductor layer.

7. A method of making an asymmetric gate MOS device according to claim 6, characterized in that, a second bias voltage is applied to the target material to partially ionize the target material into an ionic state.

8. A method of making an asymmetric gate MOS device according to claim 7, characterized in that, the first bias voltage is any of a direct current bias voltage, an alternating current bias voltage and a pulsed bias voltage, and that the second bias voltage is any of a direct current bias voltage, an alternating current bias voltage and a pulsed bias voltage.

9. A method of making an asymmetric gate MOS device according to claim 1, characterized in that, the semiconductor substrate is silicon or silicon-on-insulator, the polycrystalline semiconductor layer is a polysilicon layer, and the metal-semiconductor-compound nanowires are metal silicide nanowires.

10. A method of making an asymmetric gate MOS device according to claim 1, characterized in that, the semiconductor substrate is germanium or germanium-on-insulator, the polycrystalline semiconductor layer is a polycrystalline germanium layer, and the metal-semiconductor-compound nanowires are metal germanide nanowires.

11. A method of making an asymmetric gate MOS device according to claim 1, characterized in that, the metal-semiconductor-compound nanowires are formed from chemical reaction between metal and the polycrystalline semiconductor layer, wherein, the metal can be any of nickel, cobalt, titanium, and ytterbium, or any of nickel, cobalt, titanium, and ytterbium incorporated with platinum.

12. A method of making an asymmetric gate MOS device according to claim 11, characterized in that, the metal is further incorporated with tungsten and/or molybdenum.

13. A method of making an asymmetric gate MOS device according to claim 1, characterized in that, the substrate is at a temperature of 0~300° C. during the deposition of the metal film on the sidewalls on two sides of the polycrystalline semiconductor layer, and that the annealing temperature is about 200~900° C.

* * * * *